United States Patent
Huang et al.

(10) Patent No.: US 12,249,658 B2
(45) Date of Patent: Mar. 11, 2025

(54) SEMICONDUCTOR MEMORY DEVICE AND FABRICATION METHOD THEREOF

(71) Applicant: UNITED MICROELECTRONICS CORP., Hsin-Chu (TW)

(72) Inventors: Chun-Sung Huang, Changhua County (TW); Chi Ren, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 18/444,785

(22) Filed: Feb. 19, 2024

(65) Prior Publication Data

US 2024/0194797 A1    Jun. 13, 2024

Related U.S. Application Data

(62) Division of application No. 17/472,586, filed on Sep. 11, 2021, now Pat. No. 11,955,565.

(30) Foreign Application Priority Data

Aug. 9, 2021    (TW) ................................. 110129303

(51) Int. Cl.
*H01L 29/792* (2006.01)
*H01L 21/28* (2006.01)
*H01L 29/423* (2006.01)
*H01L 29/66* (2006.01)

(52) U.S. Cl.
CPC ...... *H01L 29/792* (2013.01); *H01L 29/40117* (2019.08); *H01L 29/42344* (2013.01); *H01L 29/66833* (2013.01)

(58) Field of Classification Search
CPC ............ H01L 29/792; H01L 29/40117; H01L 29/42344; H01L 29/66833
See application file for complete search history.

(56) References Cited

U.S. PATENT DOCUMENTS

| | | | |
|---|---|---|---|
| 7,768,061 B2 | 8/2010 | Jeon | |
| 7,786,512 B2 | 8/2010 | Bloom | |
| 9,406,687 B1 * | 8/2016 | Yang | ...................... H10B 41/42 |
| 9,911,847 B1 | 3/2018 | Chin | |
| 2004/0065917 A1 | 4/2004 | Fan | |
| 2008/0128774 A1 | 6/2008 | Irani | |

(Continued)

FOREIGN PATENT DOCUMENTS

| | | |
|---|---|---|
| CN | 109997225 A | 7/2019 |
| JP | 2013-98192 A | 5/2013 |
| WO | 2017/014254 A1 | 1/2017 |

*Primary Examiner* — Mohammad M Choudhry
(74) *Attorney, Agent, or Firm* — Winston Hsu

(57) ABSTRACT

A control gate is formed on the substrate. A source diffusion region is formed in the substrate and on a first side of the control gate. A select gate is formed on the source diffusion region. The select gate has a recessed top surface. A charge storage structure is formed under the control gate. A first spacer is formed between the select gate and the control gate and between the charge storage structure and the select gate. A wordline gate is formed on a second side of the control gate opposite to the select gate. A second spacer is formed between the wordline gate and the control gate. A drain diffusion region is formed in the substrate and adjacent to the wordline gate.

9 Claims, 6 Drawing Sheets

(56) References Cited

U.S. PATENT DOCUMENTS

| | | | |
|---|---|---|---|
| 2016/0056250 A1* | 2/2016 | Chuang | H01L 29/42344 257/326 |
| 2016/0163722 A1* | 6/2016 | Chang | H01L 29/40114 257/316 |
| 2016/0358928 A1 | 12/2016 | Wu | |

* cited by examiner

SEMICONDUCTOR MEMORY DEVICE AND FABRICATION METHOD THEREOF

CROSS REFERENCE TO RELATED APPLICATIONS

This application is a division of U.S. application Ser. No. 17/472,586, filed on Sep. 11, 2021. The content of the application is incorporated herein by reference.

BACKGROUND OF THE INVENTION

1. Field of the Invention

The present invention relates to the field of semiconductor technology, and particularly relates to a semiconductor memory device and a manufacturing method thereof.

2. Description of the Prior Art

A non-volatile memory, such as flash memory, retains stored data even if power to the memory is removed. A non-volatile memory cell stores data, for example, by storing electrical charge in an electrically isolated memory gate or in a charge-trapping layer underlying a control gate of a field-effect transistor (FET). The stored electrical charge controls the threshold of the FET, thereby controlling the memory state of the cell.

A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power application.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional flash memory cell. That makes hot-carrier injection more efficient with lower current and lower power consumption during a programming operation.

One disadvantage of the prior art is that the select gate and the control gate of the split gate memory cell need to be defined by lithography and etching processes respectively, which easily leads to problems such as overlay shift. In addition, a certain distance must be maintained between the control gate and the select gate, therefore the size of the memory cell is difficult to shrink.

SUMMARY OF THE INVENTION

It is one object of the present invention to provide an improved semiconductor memory device and a manufacturing method thereof to solve the above-mentioned shortcomings or deficiencies of the prior art.

One aspect of the invention provides a semiconductor memory device including a substrate; a control gate disposed on the substrate; a source diffusion region disposed in the substrate and on a first side of the control gate; a select gate disposed on the source diffusion region, wherein the select gate has a recessed top surface; a charge storage structure disposed under the control gate; a first spacer disposed between the select gate and the control gate and between the charge storage structure and the select gate; a wordline gate disposed on a second side of the control gate opposite to the select gate; a second spacer between the wordline gate and the control gate; and a drain diffusion region disposed in the substrate and adjacent to the wordline gate.

According to some embodiments, the charge storage structure is an oxide-nitride-oxide (ONO) film.

According to some embodiments, the recessed top surface of the select gate has a V-shaped sectional profile.

According to some embodiments, the first spacer and the second spacer are silicon oxide spacers.

According to some embodiments, the first spacer and the second spacer have a thickness of about 200-400 angstroms.

According to some embodiments, the first spacer is in direct contact with the select gate and the control gate.

According to some embodiments, the second spacer is in direct contact with the wordline gate and the control gate.

According to some embodiments, the semiconductor memory device further includes a select gate oxide layer between the select gate and the source diffusion region, and a wordline gate oxide layer between the wordline gate and the substrate.

According to some embodiments, the wordline gate has an inner sidewall, an outer sidewall, and a stepped top surface between the inner sidewall and the outer sidewall, wherein the stepped top surface comprises a first surface region descending from the inner sidewall to the outer sidewall, and a second surface region between the first surface region and the outer sidewall, wherein a slope of the first surface region is smaller than that of the second surface region.

According to some embodiments, the stepped top surface further comprises a third surface region connecting the second surface region with the outer sidewall, wherein the second surface region, the third surface region and the outer sidewall constitute a step structure.

According to some embodiments, a third spacer is disposed on the outer sidewall of the wordline gate.

Another aspect of the invention provides a method for forming a semiconductor memory device. A substrate is provided. A control gate is formed on the substrate. A source diffusion region is formed in the substrate and on a first side of the control gate. A select gate is formed on the source diffusion region. The select gate has a recessed top surface. A charge storage structure is formed under the control gate. A first spacer is formed between the select gate and the control gate and between the charge storage structure and the select gate. A wordline gate is formed on a second side of the control gate opposite to the select gate. A second spacer is formed between the wordline gate and the control gate. A drain diffusion region is formed in the substrate and adjacent to the wordline gate.

According to some embodiments, the charge storage structure is an oxide-nitride-oxide (ONO) film.

According to some embodiments, the recessed top surface of the select gate has a V-shaped sectional profile.

According to some embodiments, the first spacer and the second spacer are silicon oxide spacers.

According to some embodiments, the first spacer and the second spacer have a thickness of about 200-400 angstroms.

According to some embodiments, the first spacer is in direct contact with the select gate and the control gate.

According to some embodiments, the second spacer is in direct contact with the wordline gate and the control gate.

According to some embodiments, a select gate oxide layer is formed between the select gate and the source diffusion region, and a wordline gate oxide layer is formed between the wordline gate and the substrate.

According to some embodiments, the wordline gate has an inner sidewall, an outer sidewall, and a stepped top surface between the inner sidewall and the outer sidewall, wherein the stepped top surface comprises a first surface region descending from the inner sidewall to the outer sidewall, and a second surface region between the first surface region and the outer sidewall, wherein a slope of the first surface region is smaller than that of the second surface region.

According to some embodiments, the stepped top surface further comprises a third surface region connecting the second surface region with the outer sidewall, wherein the second surface region, the third surface region and the outer sidewall constitute a step structure.

According to some embodiments, a third spacer is formed on the outer sidewall of the wordline gate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
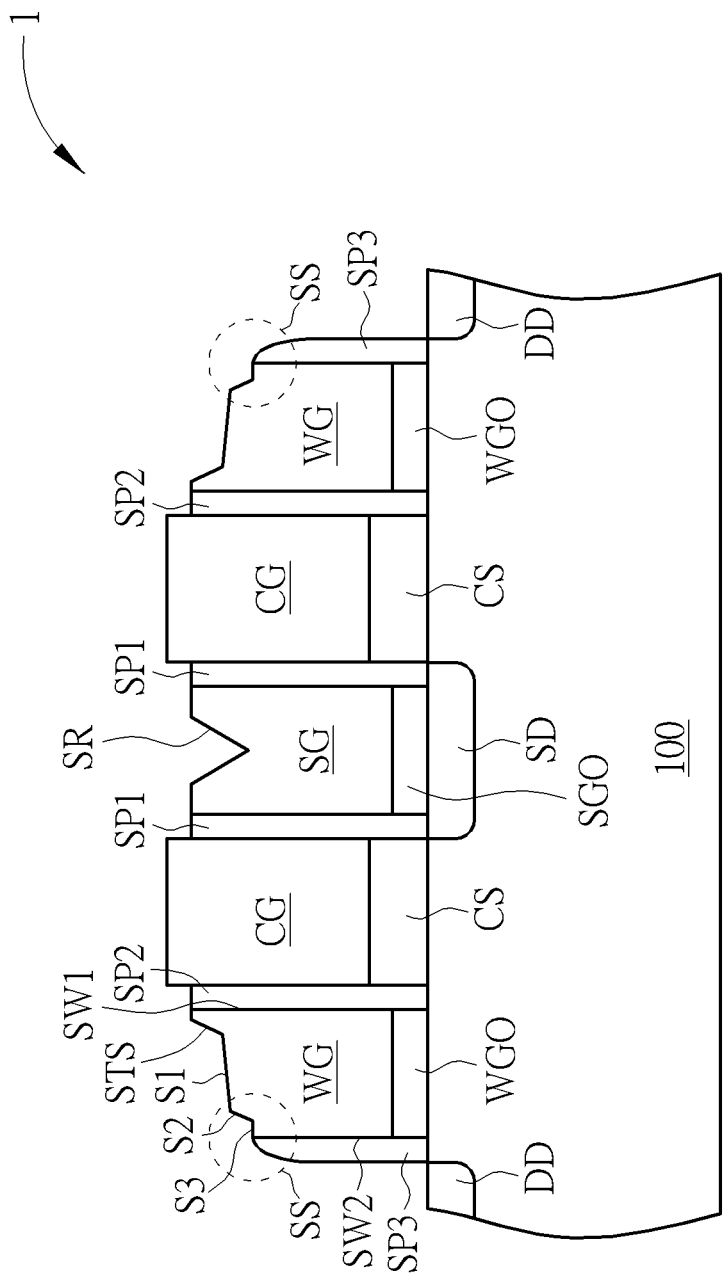
FIG. 1 is a schematic cross-sectional view of a semiconductor memory device according to an embodiment of the present invention.

Please refer to FIG. 1, which is a schematic cross-sectional view of a semiconductor memory device according to an embodiment of the present invention. As shown in FIG. 1, the semiconductor memory device 1 includes a substrate 100, for example, a semiconductor substrate. At least one control gate CG is provided on the substrate 100. A source diffusion region SD is provided in the substrate 100 and located on the first side of the control gate CG. A select gate SG is provided on the source diffusion region SD. The select gate SG has a recessed top surface SR. According to an embodiment of the present invention, the recessed top surface SR of the select gate SG has a V-shaped cross-sectional profile. According to an embodiment of the present invention, the semiconductor memory device 1 further includes a select gate oxide layer SGO disposed between the select gate SG and the source diffusion region SD.

According to an embodiment of the present invention, a charge storage structure CS is provided under the control gate CG. According to an embodiment of the present invention, the charge storage structure CS is an oxide-nitride-oxide (ONO) film, but is not limited thereto. According to an embodiment of the present invention, the sidewalls of the charge storage structure CS and the control gate CG are aligned.

According to an embodiment of the present invention, a first spacer SP1 is provided between the select gate SG and the control gate CG and between the charge storage structure CS and the control gate CG. According to an embodiment of the present invention, the first spacer SP1 may be a silicon oxide spacer, but is not limited thereto. According to an embodiment of the present invention, the thickness of the first spacer SP1 is about 200-400 angstroms. According to an embodiment of the present invention, the first spacer SP1 directly contacts the select gate SG and the control gate CG. According to an embodiment of the present invention, the first spacer SP1 directly contacts the charge storage structure CS.

According to an embodiment of the present invention, a wordline gate WG is provided on the second side of the control gate CG opposite to the select gate SG. A second spacer SP2 is provided between the wordline gate WG and the control gate CG. According to an embodiment of the present invention, the second spacer SP2 may be a silicon oxide spacer, but is not limited thereto. According to an embodiment of the present invention, the thickness of the second spacer SP2 is about 200-400 angstroms. According to an embodiment of the present invention, the second spacer SP2 directly contacts the wordline gate WG and the control gate CG. According to an embodiment of the present invention, the semiconductor memory device 1 further includes a wordline gate oxide layer WGO disposed between the wordline gate WG and the substrate 100.

According to an embodiment of the present invention, a third spacer SP3, for example, a silicon nitride spacer is additionally provided on the wordline gate WG. According to an embodiment of the present invention, a drain diffusion region DD is provided in the substrate 100 adjacent to the third spacer SP3. It can be seen from FIG. 1 that the semiconductor memory element 1 has a mirror-symmetrical structure with respect to the select gate SG According to an embodiment of the present invention, the wordline gate WG has an inner sidewall SW1, an outer sidewall SW2, and a stepped top surface STS located between the inner sidewall SW1 and the outer sidewall SW2. The stepped top surface STS includes a first surface region S1 descending from the inner sidewall SW1 to the outer sidewall SW2, and a second surface region S2 between the first surface region S1 and the outer sidewall SW2. The slope of the first surface region S1 is smaller than that of the second surface region S2.

According to an embodiment of the present invention, the stepped top surface STS further includes a third surface region S3 connecting the second surface region S2 and the outer sidewall SW2. The second surface region S2, the third surface region S3 and the outer sidewall SW2 constitute a step structure SS.

Figure 2:
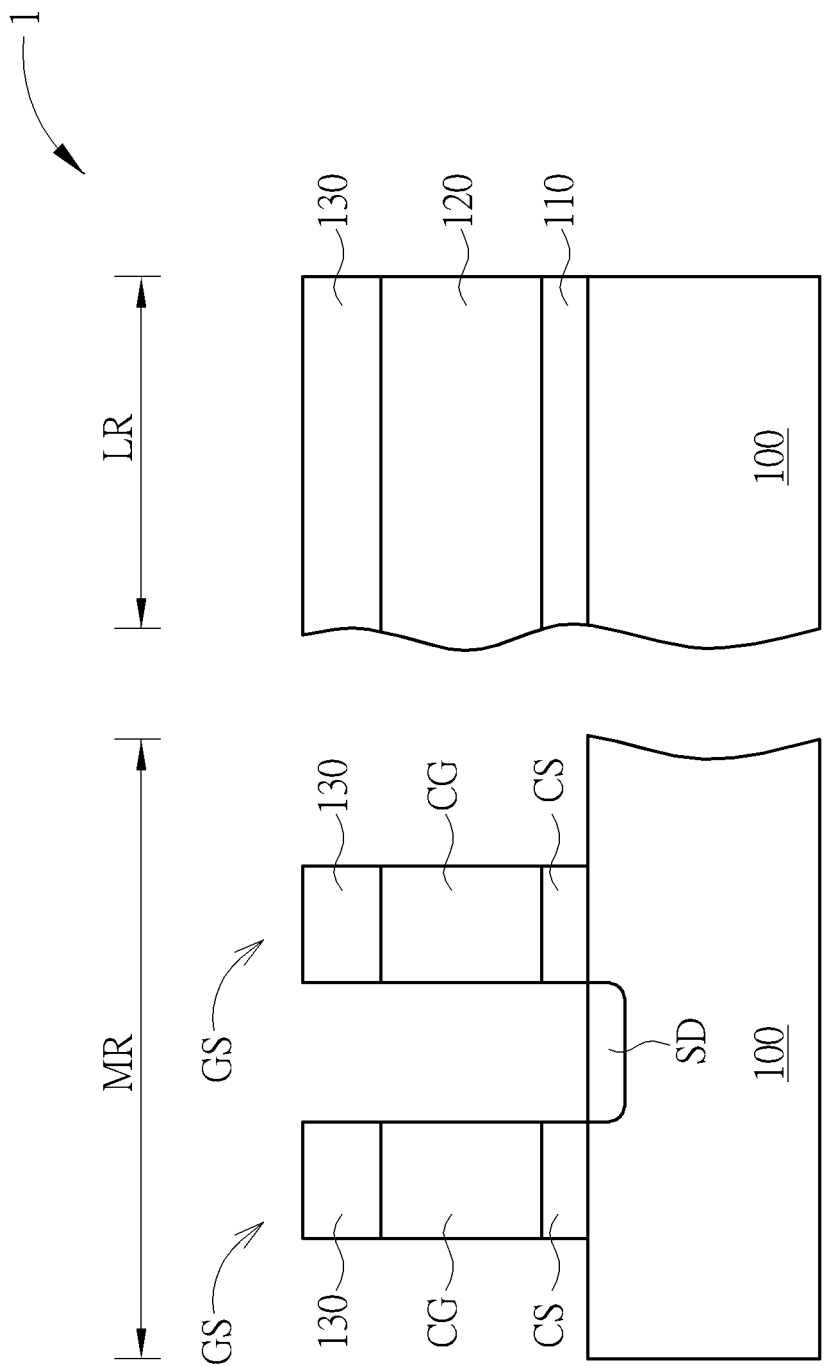
FIG. 2 to FIG. 6 are schematic diagrams showing a method of making a semiconductor memory device according to an embodiment of the present invention.

Please refer to FIG. 2 to FIG. 6, which are schematic diagrams of the manufacturing method of the semiconductor memory device According to an embodiment of the present invention. As shown in FIG. 2, first, a substrate 100 is provided, for example, a silicon substrate or other suitable semiconductor substrate. According to an embodiment of the present invention, the substrate 100 has a memory region MR and a logic circuit region LR. A gate structure GS formed by stacking a control gate CG and a charge storage structure CS is formed in the memory region MR. The control gate CG may be a polysilicon layer, and the charge storage structure CS may be an ONO film.

According to an embodiment of the present invention, in FIG. 1, the logic circuit region LR is covered by the silicon oxide layer 110 and the polysilicon layer 120. A hard mask layer 130 is formed on the polysilicon layer 120, for example, a silicon nitride layer. In addition, a source diffusion region SD, for example, an $N^+$ doped region, is formed in the substrate 100 between the gate structures GS within the memory region MR.

Figure 3:
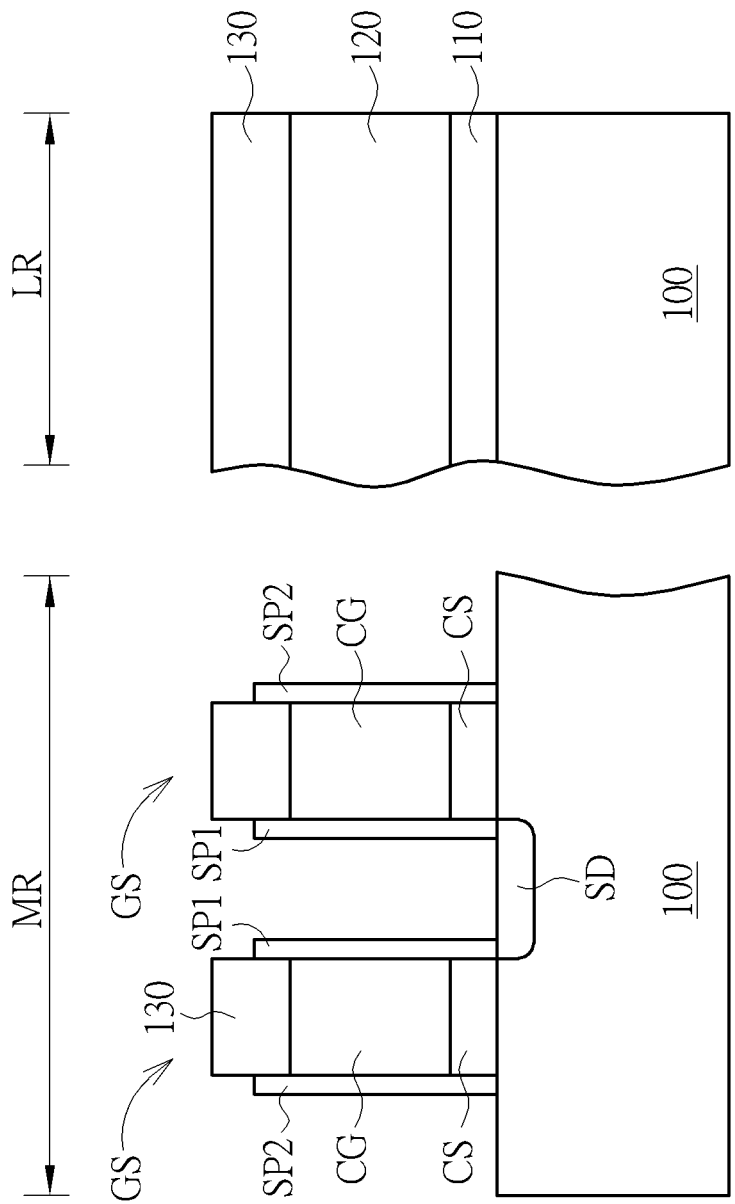

As shown in FIG. 3, next, a first spacer SP1 and a second spacer SP2 are respectively formed on the sidewalls of the gate structure GS in the memory region MR. According to an embodiment of the present invention, the first spacer SP1 and the second spacer SP2 may comprise silicon oxide, silicon nitride, or silicon oxynitride, but are not limited thereto. According to an embodiment of the present invention, the thickness of the spacers SP1 and SP2 is about 200-400 angstroms.

Figure 4:
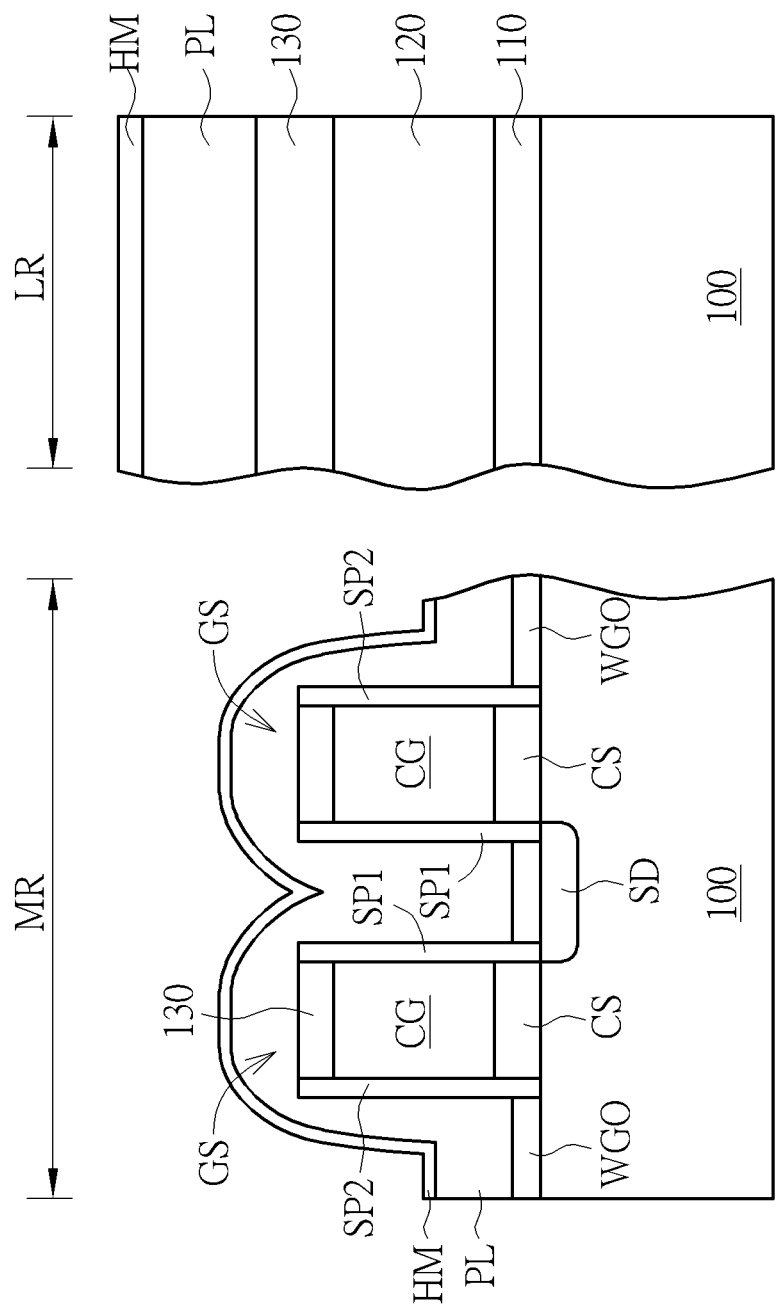

As shown in FIG. 4, next, a wordline gate oxide layer WGO and a select gate oxide layer SGO are formed on the substrate 100 in the memory region MR. For example, the wordline gate oxide layer WGO and the select gate oxide layer SGO may be silicon oxide layers with a thickness of about 50-70 angstroms. Then, a polysilicon layer PL and a hard mask layer HM are sequentially deposited on the substrate 100 by using a chemical vapor deposition (CVD) process or the like. According to an embodiment of the present invention, for example, the hard mask layer HM may be a silicon oxide layer with a thickness of about 100 angstroms. The space between the first spacers SP1 in the memory region MR can be filled by the polysilicon layer PL.

Figure 5:
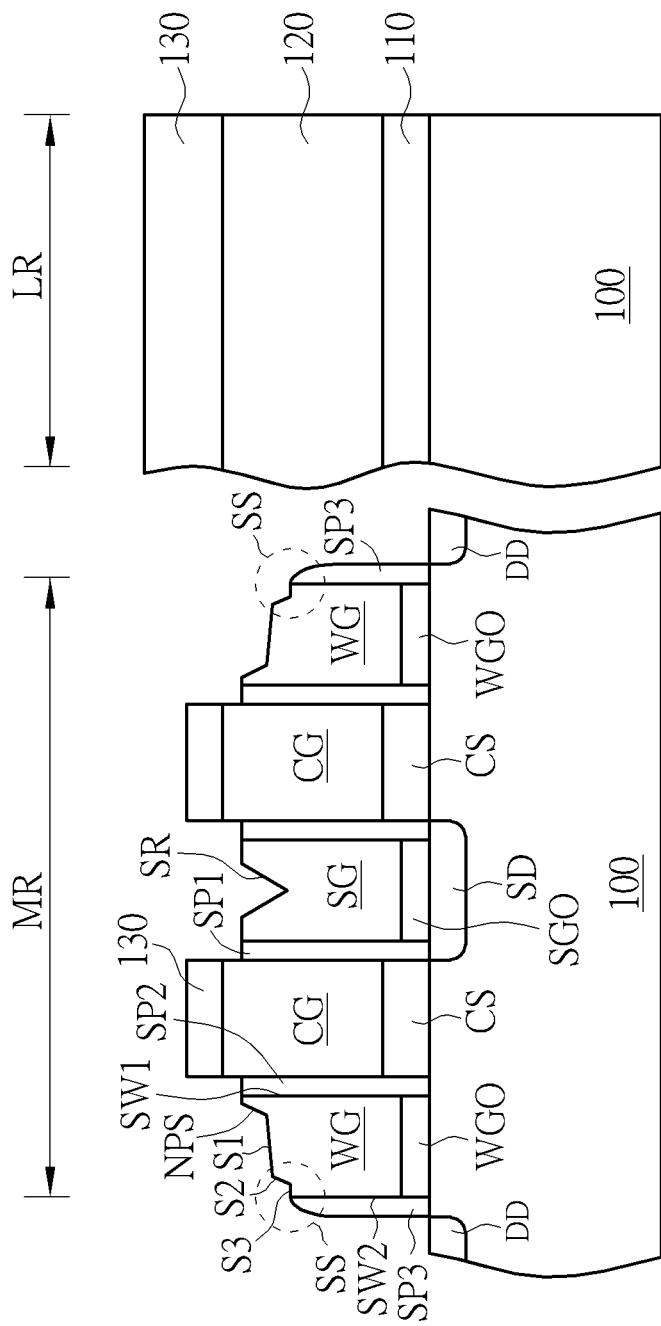

As shown in FIG. 5, an etching process, for example, an anisotropic dry etching process is then performed to sequentially etch the hard mask layer HM and the polysilicon layer PL until the hard mask layer 130 is exposed. By using such self-alignment method, a select gate SG is formed between the first spacer SP1 in the memory region MR, and a wordline gate WG is formed beside the second spacer SP2.

According to an embodiment of the present invention, the select gate SG has a recessed top surface SR. According to an embodiment of the present invention, the recessed top surface SR of the select gate SG has a V-shaped cross-sectional profile. The wordline gate WG has a stepped top surface STS and the stepped top surface STS includes a first surface region S1 that descends from the inner sidewall SW1 to the outer sidewall SW2, and a second surface region S2 between the first surface region S1 and the outer sidewall SW2. The slope of the first surface region S1 is smaller than the slope of the second surface region S2.

Subsequently, a third spacer SP3 is formed on the outer sidewall SW2 of the wordline gate WG. For example, the third spacer SP3 may comprise silicon oxide, silicon nitride or silicon oxynitride, but is not limited thereto. An ion implantation process is then performed to form a drain diffusion region DD, for example, an $N^+$ doped region, in the substrate 100 adjacent to the third spacer SP3.

Figure 6:
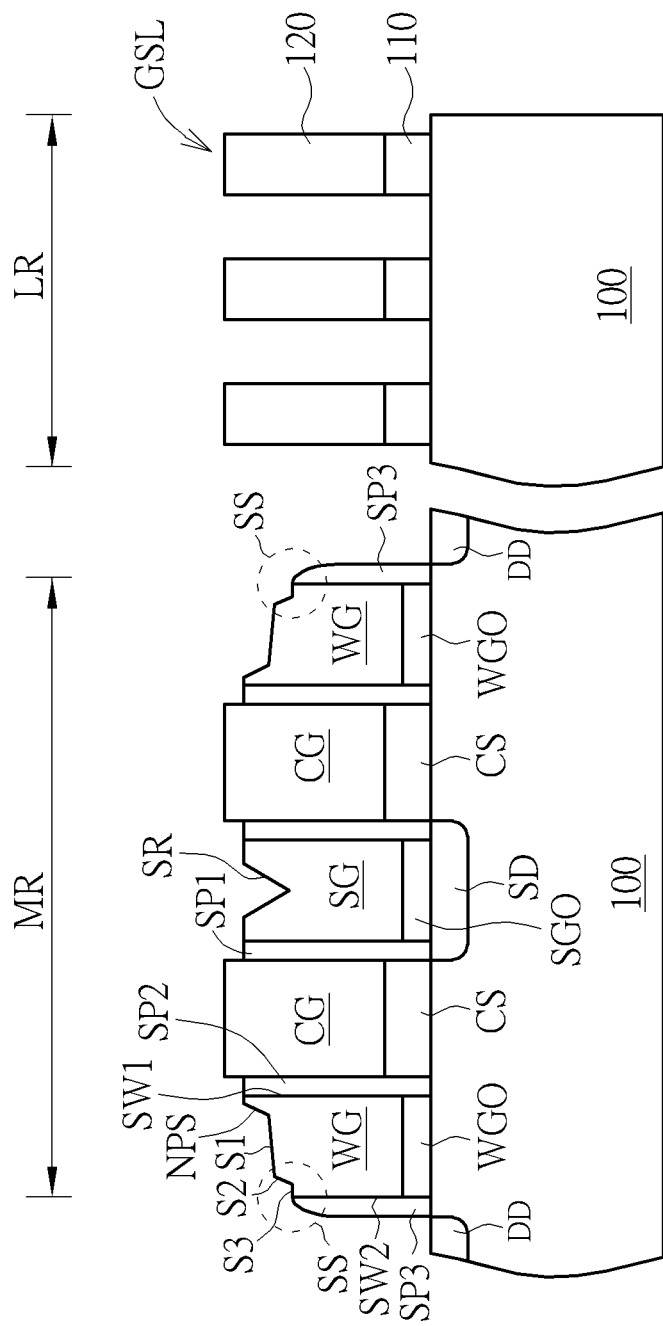

As shown in FIG. 6, next, the hard mask layer 130 is removed, and then a lithography process and an etching process are performed to pattern the polysilicon layer 120 and the silicon oxide layer 110 in the logic circuit region LR, thus forming the gate structure GSL.

One advantage of the present invention is that the select gate and the wordline gate are simultaneously formed on both sides of the control gate in a self-aligned manner, so that the distance between the control gate and the select gate and the wordline gate is closer, and is determined by the thickness of the spacer, so the size of the memory cell can be further reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor memory device, comprising:
    providing a substrate;
        forming a control gate on the substrate;
        forming a source diffusion region in the substrate and on a first side of the control gate;
        forming a select gate on the source diffusion region, wherein the select gate has a recessed top surface;
        forming a charge storage structure under the control gate;
        forming a first spacer between the select gate and the control gate and between the charge storage structure and the select gate;
        forming a wordline gate on a second side of the control gate opposite to the select gate;
        forming a second spacer between the wordline gate and the control gate; and
        forming a drain diffusion region in the substrate and adjacent to the wordline gate, wherein the wordline gate has an inner sidewall, an outer sidewall, and a stepped top surface between the inner sidewall and the outer sidewall, wherein the stepped top surface comprises three sloped surface regions contiguous to one another, the three sloped surface regions include a first surface region descending from the inner sidewall to the outer sidewall, a second surface region between the first surface region and the outer sidewall, and a third surface region connecting the second surface region with the outer sidewall, wherein a slope of the first surface region is smaller than that of the second surface region, wherein the second surface region, the third surface region and the outer sidewall constitute a step structure.

2. The method according to claim 1, wherein the charge storage structure is an oxide-nitride-oxide (ONO) film.

3. The method according to claim 1, wherein the recessed top surface of the select gate has a V-shaped sectional profile.

4. The method according to claim 1, wherein the first spacer and the second spacer are silicon oxide spacers.

5. The method according to claim 1, wherein the first spacer and the second spacer have a thickness of about 200-400 angstroms.

6. The method according to claim 1, wherein the first spacer is in direct contact with the select gate and the control gate.

7. The method according to claim 1, wherein the second spacer is in direct contact with the wordline gate and the control gate.

8. The method according to claim 1 further comprising:
    forming a select gate oxide layer between the select gate and the source diffusion region; and forming a wordline gate oxide layer between the wordline gate and the substrate.

9. The method according to claim 1 further comprising:
forming a third spacer on the outer sidewall of the wordline gate.

\* \* \* \* \*